(12) United States Patent
Gowdamachandran et al.

(10) Patent No.: US 10,325,792 B2
(45) Date of Patent: Jun. 18, 2019

(54) METHODS AND APPARATUS FOR INTERACTIVELY AND DYNAMICALLY UPDATING A SCHEMATIC OVERLAY

(71) Applicant: APPLIED MATERIALS, INC., Santa Clara, CA (US)

(72) Inventors: Balaji Gowdamachandran, Pflugerville, TX (US); Brent Allen Dooley, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 513 days.

(21) Appl. No.: 15/048,183

(22) Filed: Feb. 19, 2016

(65) Prior Publication Data

US 2017/0178932 A1  Jun. 22, 2017

Related U.S. Application Data

(60) Provisional application No. 62/269,006, filed on Dec. 17, 2015.

(51) Int. Cl.
    *G06F 19/00* (2018.01)
    *H01L 21/67* (2006.01)
    *G05B 19/418* (2006.01)

(52) U.S. Cl.
    CPC .... *H01L 21/67167* (2013.01); *G05B 19/4184* (2013.01); *G05B 19/41875* (2013.01); *H01L 21/67201* (2013.01); *G05B 2219/31478* (2013.01); *G05B 2219/35269* (2013.01); *G05B 2219/45031* (2013.01); *Y02P 90/14* (2015.11); *Y02P 90/265* (2015.11)

(58) Field of Classification Search
    CPC .................. H01L 21/67167; H01L 21/67201
    USPC ......................................... 700/109, 110, 121
    See application file for complete search history.

(56) References Cited

U.S. PATENT DOCUMENTS

| 7,065,723 B2 | 6/2006 | Tran et al. |
| 7,123,980 B2 | 10/2006 | Funk et al. |
| 2006/0214947 A1 | 9/2006 | Boose et al. |

(Continued)

OTHER PUBLICATIONS

International Search Report and Written Opinion dated Apr. 5, 2017 for PCT Application No. PCT/US2016/066903.

*Primary Examiner* — Connie C Yoha
(74) *Attorney, Agent, or Firm* — Moser Taboada; Alan Taboada

(57) ABSTRACT

A computer implemented method of dynamically updating an interactive diagnostic schematic overlay comprises displaying a first drawing comprising a plurality of static graphical objects, each static graphical object corresponding to a design element of a complex system and identifying a diagnostic schematic overlay comprising a plurality of dynamic graphical objects, wherein each dynamic graphical object is aligned with a static graphical object of the plurality of static graphical objects. In an embodiment, the diagnostic schematic overlay further includes a plurality of fields, wherein each field may be populated with one or more dynamic graphical objects, and the method further includes determining a design element operating state and/or a design element operating parameter for at least some of the static graphical objects at a first instance in time and displaying, together with the first drawing, determined operating states and determined operating parameters as an updated diagnostic schematic overlay.

20 Claims, 6 Drawing Sheets

(56) References Cited

U.S. PATENT DOCUMENTS

| | | |
|---|---|---|
| 2007/0093921 A1 | 4/2007 | Braun et al. |
| 2008/0235624 A1* | 9/2008 | Murata ................ G06F 3/0482 715/825 |
| 2009/0125906 A1* | 5/2009 | Moore, Jr. ....... G05B 19/41865 718/101 |
| 2011/0029102 A1 | 2/2011 | Campney et al. |
| 2014/0085332 A1 | 3/2014 | McGreevy et al. |
| 2014/0257531 A1 | 9/2014 | McGreevy et al. |

* cited by examiner

METHODS AND APPARATUS FOR INTERACTIVELY AND DYNAMICALLY UPDATING A SCHEMATIC OVERLAY

CROSS-REFERENCE TO RELATED APPLICATIONS

This application claims benefit of U.S. provisional patent application Ser. No. 62/269,006, filed Dec. 17, 2015, which is herein incorporated by reference in its entirety.

FIELD

Embodiments of the present disclosure generally relate to techniques for monitoring and/or determining the health and/or performance of discrete design elements which collectively form a complex system, and more particularly, to techniques for monitoring and/or determining the health and/or performance of discrete design elements as part of a microelectronic device fabrication system.

BACKGROUND

Diagnostic systems are used by technicians and professionals in a diverse variety of industries. For example, in the automotive, trucking, heavy equipment, and aircraft industries, diagnostic test systems provide for vehicle onboard computer fault or trouble code display, interactive diagnostics, muitiscope and multimeter functions, and electronic service manuals. In the medical industry, diagnostic systems provide for monitoring body functions and diagnosis of medical conditions, as well as system diagnostics to detect anomalies in the medical equipment.

Diagnostic systems have a disadvantage in that the textual instructions can seem tedious or difficult to understand or interpret. At some point, the technician seeking to identify a point of failure or fault within a complex system may need to scroll through many pages of electrical schematics in order to identify potential points of failure and, after doing so, perform tedious manual measurements of each design element so identified in order to determine which components are not performing within an applicable tolerance.

SUMMARY

Systems and methods are disclosed herein for displaying one or more static schematic(s) with one or more corresponding diagnostic overlays to facilitate, for example, the identification of one or more design elements, depicted in the static schematic(s), as a potential point of failure.

In one or more embodiments, a computer implemented method of dynamically updating an interactive diagnostic schematic overlay includes displaying a first drawing comprising a plurality of static graphical objects. Each static graphical object corresponds to a design element of a complex system. The method further comprises identifying a diagnostic schematic overlay. The diagnostic schematic overlay comprises a plurality of fields, wherein each field of the plurality of fields is aligned with a static graphical object of the plurality of static graphical objects, and a plurality of dynamic graphical objects, wherein each dynamic graphical object of the plurality of dynamic graphical objects is associated with a field of the plurality of fields and corresponds to one of a design element operating state or a design element operating parameter. The method further comprises determining at least one of a design element operating state or a design element operating parameter for at least some of the static graphical objects at a first instance in time; and displaying, together with the first drawing, determined operating states and determined operating parameters as an updated diagnostic schematic overlay.

In some embodiments, a method of dynamically updating an interactive diagnostic schematic overlay includes: displaying a plurality of static graphical objects, each static graphical object corresponding to a design element of a complex system; determining at least one of a design element operating state or a design element operating parameter; and displaying, together with the static graphical objects, determined operating states and determined operating parameters as an updated diagnostic schematic overlay.

In some embodiments, a system for determining an operating state or operating condition of one or more design elements of a complex system having a plurality of design elements includes at least one processor; a display device; and a memory containing instructions executable by the at least one processor to display, on the display device, a first drawing comprising a plurality of static graphical objects. Each static graphical object corresponds to a design element of a complex system. The instructions stored in the memory are further executable by the at least one processor to identify a diagnostic schematic overlay. The diagnostic schematic overlay comprises a plurality of fields, wherein each field of the plurality of fields is aligned with a static graphical object of the plurality of static graphical objects, and a plurality of dynamic graphical objects, wherein each dynamic graphical object of the plurality of dynamic graphical objects is associated with a field of the plurality of fields and corresponds to one of a design element operating state or a design element operating parameter. The instructions stored in the memory are further executable by the at least one processor to determine at least one of a design element operating state or a design element operating parameter for at least some of the static graphical objects at an instant in time, and initiate display, on the display device together with the first drawing, determined operating states and determined operating parameters as an updated diagnostic schematic overlay.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification

BRIEF DESCRIPTION OF THE DRAWINGS

A further understanding of the nature and advantages of the disclosed embodiments may be realized by reference to the remaining portions of the specification and the drawings. The appended drawings illustrate only exemplary embodiments consistent with the appended disclosure and are not to be considered limiting, for the disclosure may admit to other, equally effective embodiments.

Figure 1A:
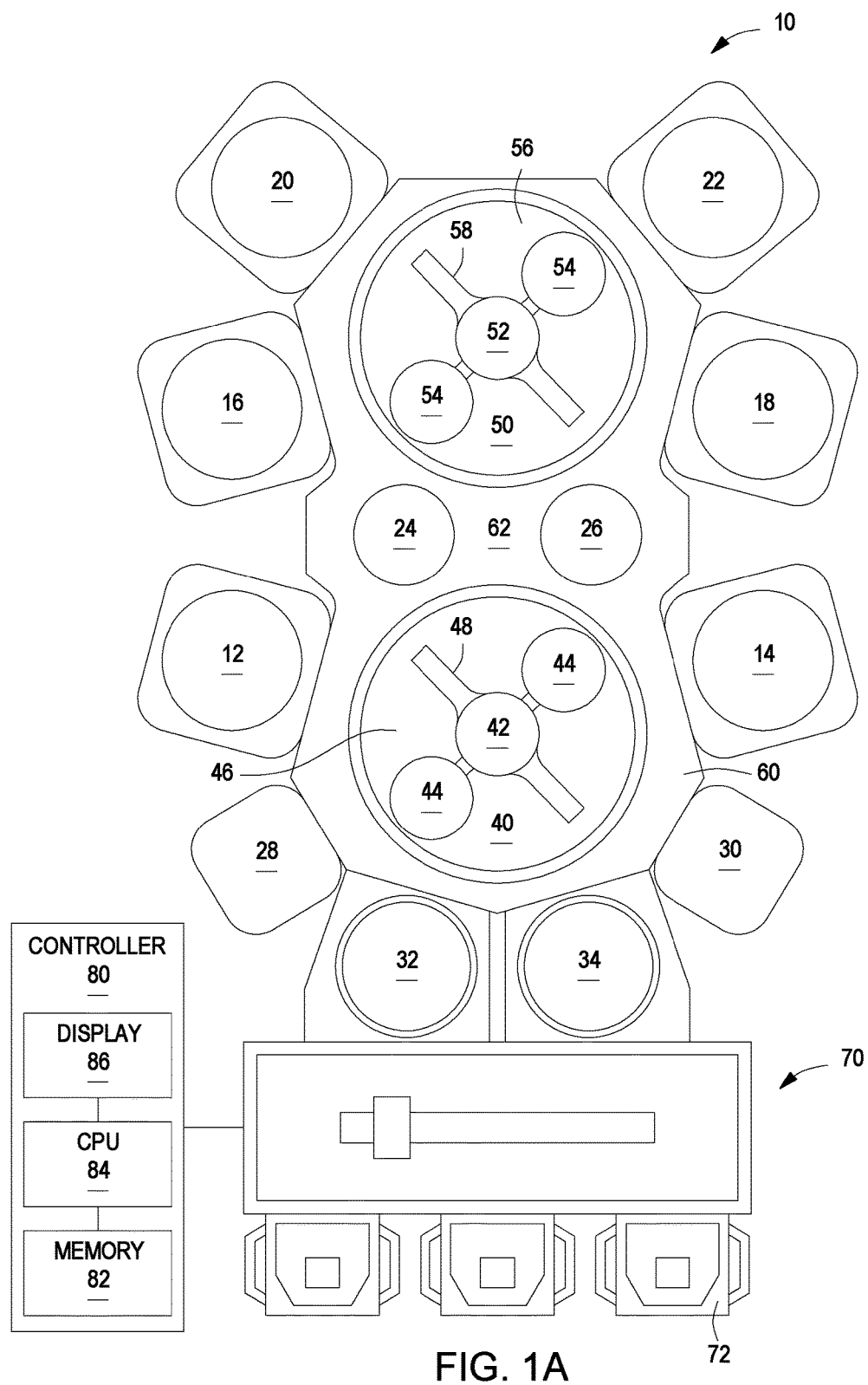
FIG. 1A is a block schematic diagram depicting an exemplary complex system to which generating and updating of a diagnostic schematic overlay to a drawing comprising static design elements can be applied according to embodiments consistent with the present disclosure.

To facilitate understanding, identical reference numerals have been used, where possible, to designate identical elements that are common to the figures. The figures are not drawn to scale and may be simplified for clarity. Moreover, elements and features of one embodiment may be beneficially incorporated in other embodiments consistent with the present disclosure without further recitation.

DETAILED DESCRIPTION

Embodiments consistent with the present disclosure generally provide an interactive, dynamically updated diagnostic schematic overlay to one or more static schematic diagrams depicting a plurality of interdependent design elements coupled to one another to form a complex system, and include methods and apparatuses for performing the same. By way of illustration, a processing system such as a cluster tool used in the formation and fabrication of devices and interconnections on a substrate may comprise many inter-dependent design elements. Non limiting examples of design elements include one or more of temperature sensing transducers, pressure sensing transducers, switches actuated to open and close valves for flowing gases into or evacuating them from a processing chamber, or to detect complete (or incomplete) closure of a sealing lid, position sensors to detect the location of a substrate, support platform, and/or a substrate transport mechanism, relays and contacts, and even the passive interconnecting wires which link the respective components to one another and/or to a power supply.

According to one or more embodiments, instantaneous values of operating state parameters and operating states associated with the design elements of a complex system are retrieved from software and hardware drivers used to operate and/or test the complex system and these values are utilized to populate one or more fields of a schematic overlay aligned with a corresponding design element. Software executed by a processor to operate a complex system such, for example, as a cluster tool is typically configured to initiate display of such operating state parameters as measurements of gas flow rate, pressure, and temperature. The hardware and associated drivers for operating the complex system may be configured to collect and use real time transducer signals (e.g. voltage signals) from which such measurements may be derived directly or indirectly. The inventors herein have recognized that such signals can also be used to dynamically update a diagnostic schematic overlay to a static drawing so that the actual behavior of the design elements can be visualized to facilitate identification of malfunctioning components and other faults, and/or confirm that other components are functioning within their normal tolerances for a given set of operating conditions.

As an example of a complex system to which generation and updating of a diagnostic schematic overlay to a drawing comprising static design elements can be applied according to embodiments consistent with the present disclosure, a cluster tool 10 comprising multiple processing chambers for processing substrates is illustrated in FIG. 1A. The scope of the present disclosure, however, is not limited to substrate processing systems, and the depiction in FIGS. 1A and 1B of substrate processing arrangements is for ease of illustration and clarity of explanation only. Indeed, the teachings set forth herein are applicable to any complex arrangement of design elements capable of being represented in a schematic form. Other embodiments consistent with the present disclosure are applicable to such other complex systems as multi-function printer systems, automotive and aircraft systems, hydraulic systems, and many others.

The cluster tool 10 of FIG. 1A may be a dual buffer chamber, multiple process chamber semiconductor processing tool or dual buffer chamber cluster tool. The cluster tool 10 may be an Endura® platform having various attached chambers available from Applied Materials, Inc., located in Santa Clara, Calif. Attached to the cluster tool 10 may be a factory interface (FI 70) with one or more front opening, unified pods (FOUPS 72) for handling and transporting substrates from one area of a semiconductor fab to another area. Each FOUP is a container having a stationary cassette with a front opening interface used with an automated material handling system, and may be used to reduce particle counts on substrates because the interior of a FOUP is isolated from the ambient fab environment.

The FI 70 removes substrates from the FOUPS 72 to begin a processing sequence. The cluster tool 10 has a first buffer chamber 40 and a second buffer chamber 50, and a first substrate transfer location 24 and a second substrate transfer location 26 disposed within a polygonal structure 60. The first buffer chamber 40 may be a low quality vacuum buffer and the second buffer chamber 50 may be a high quality vacuum. The substrate transfer locations may each be a chamber.

A first load lock chamber 32 and second load lock chamber 34 may be disposed on the one side of the polygonal structure 60. A first degas chamber 28 and second degas chamber 30 may be disposed on generally opposite sides of the polygonal structure and adjacent the first load lock chamber 32 and second load lock chamber 34. A first pair of process chambers comprising first process chamber 12 and second process chamber 14 may be disposed on generally opposite sides of the polygonal structure 60 and adjacent chambers as first degas chamber 28, second degas chamber 30, and first buffer chamber 40. Each of the first process chamber 12 and second process chamber 14 may be a Versa™ W plasma vapor deposition (PVD) chamber for forming a film on a substrate, available from Applied Materials, Inc., of Santa Clara, Calif. A second pair of process chambers comprising third process chamber 16 and fourth process chamber 18 may be disposed on generally opposite sides of the polygonal structure 360 and adjacent to second buffer chamber 50. Each of the third process chamber 16 and fourth process chamber 18 may be, by way of illustrative example, a Falcon TTN PVD chamber, also available from Applied Materials, Inc. A third pair of process chambers comprising fifth process chamber 20 and sixth process chamber 22 may be disposed on generally opposite sides of the polygonal structure 60 and adjacent to the third process chamber 16, fourth process chamber 18, and second buffer chamber 50. The third pair of process chambers may be chambers for depositing a silicon-containing layer, for example, also available from Applied Materials, Inc.

Process and load lock chambers may be selectively isolated from the first buffer chamber 40 and second buffer chamber 50 by a plurality of slit valves (none of which are shown) creating a first and second environment, 46 and 56, respectively. The polygonal structure 60 has a central wall 62 which separates first buffer chamber 40 and second buffer chamber 50. The first substrate transfer location 24 and second substrate transfer location 26 provide individual passage though the central wall 62 to the first buffer chamber 40 and second buffer chamber 50. The first substrate transfer location 24 and a second substrate transfer location 26 are selectively isolated from adjoining first buffer chamber 40 and second buffer chamber 50 by a plurality of slit valves (not shown). For example, one slit valve may be provided between first buffer chamber 40 and the first substrate transfer location 24, one additional slit valve may be provided between first substrate transfer location 24 and second buffer chamber 50, one slit valve may be provided between first buffer chamber 40 and second substrate transfer location 26 and one slit valve may be provided between second buffer chamber 50 and second substrate transfer location 26. The use of the slit valves allows for the pressure in each chamber to be individually controlled. Each of first substrate transfer location 24 and second substrate transfer location 26 additionally may have a substrate pedestal (not shown), respectively, for supporting a corresponding substrate at each location.

The first buffer chamber 40 is circumscribed by the first load lock chamber 32, second load lock chamber 34, first degas chamber 28, second degas chamber 30, first process chamber 12, second process chamber 14, first substrate transfer location 24 and second substrate transfer location 26. Each of the first process chamber 12, second process chamber 14, first degas chamber 28, second degas chamber 30, first load lock chamber 32, and second load lock chamber 34 are selectively isolated from the first buffer chamber 40 by a further slit valve (not shown). Located within the first buffer chamber 40 is a first robotic substrate transport mechanism 42, e.g., a multi-blade robot. Other types of transport mechanisms may be substituted. The first robotic substrate transport mechanism 42 shown may have substrate transport blades 48 supporting one or more of the substrates 44. The substrate transport blades 48 are used by first robotic substrate transport mechanism 42 for carrying substrates individually to and from chambers circumscribing the first buffer chamber 40.

The second buffer chamber 50 is circumscribed by the third process chamber 16, fourth process chamber 18, fifth process chamber 20 and sixth process chamber 22, first substrate transfer location 24 and second substrate transfer location 26. Located within the second buffer chamber 50 is a second robotic substrate transport mechanism 52, e.g., a multi-blade robot. Other types of transport mechanisms may be substituted. The second robotic substrate transport mechanism 52 shown may have substrate transport blades 58 supporting one or more of the substrates 54. The substrate transport blade 58 is used by second robotic substrate transport mechanism 52 for carrying the individual substrates to and from chambers circumscribing the second buffer chamber 50.

The first buffer chamber 40 and second buffer chamber 50 may have vacuum ports connected to a pumping mechanism (not shown), such as a turbo molecular pump. The configuration and location of the vacuum ports may vary dependent on design criteria for individual systems. Substrate processing, for example, may begin with the first buffer chamber 40 and second buffer chamber 50 being pumped down to a vacuum condition by a pumping mechanism. The first robotic substrate transport mechanism 42 retrieves a substrate 44 from one of the load lock chambers (e.g. first load lock chamber 32) and carries that substrate to the first stage of processing, for example, the first degas chamber 28 which may be used to degas the substrate 44 including structures formed thereon in preparation for subsequent processing.

In a next stage of processing, the substrate may be carried to the third process chamber 16 or to the fourth process chamber 18 in order to fabricate one or more layers of a substrate. Once the first robotic substrate transport mechanism 42 is no longer carrying a substrate, the first robotic substrate transport mechanism 42 can tend substrates in one or more other chamber(s) that surround or are adjacent to the first buffer chamber 40. Once the substrate is processed and a plasma vapor deposition (PVD) stage deposits material upon the substrate, the substrate can then be moved to a second stage of processing, and so on. For example, the substrate may then be moved to, for example, fifth processing chamber 20 or sixth processing chamber 22.

If a processing chamber is located adjacent to second buffer chamber 50, the substrate may be transported into one of the substrate transfer locations (e.g. first substrate transfer location 24). A slit valve (not shown) separating first buffer chamber 40 and first substrate transfer location 24 is opened. The first robotic substrate transport mechanism 42 transports the substrate into the first substrate transfer location 24. The substrate transport blade 48 connected to first robotic substrate transport mechanism 42 is removed from first substrate transfer location 24 leaving the substrate on the pedestal. After the slit valve separating the first buffer chamber 40 and the first substrate transfer location 24 is closed, a second slit valve (not shown) separating the second buffer chamber 50 and the first substrate transfer location 24 is opened, allowing the substrate transport blade 58 connected to the second robotic substrate transport mechanism 52 to be inserted into first substrate transfer location 24 to retrieve the substrate. Once the substrate is inside second buffer chamber 50, the second slit valve is closed and the second robotic substrate transport mechanism 52 is free to move the substrate to an appropriate processing chamber or sequence of chambers serviced by second buffer chamber 50 and second robotic substrate transport mechanism 52. After substrate processing terminates, the substrate is loaded into one of the FOUPS 72 on the FI 70, moving the substrate back through the substrate transfer location as appropriate.

Position sensing transducers (not shown) positioned within first buffer chamber 40 provide electrical signals from which the angular position of the substrate transport blades 48 and associated substrates 44 are determined by hardware drivers and associated operating software stored within memory 82 and executed by a processor 84 of a control system 80. Other transducers such, for example as temperature and pressure sensors (not shown) are distributed among the various chambers of cluster tool 10 and generate signals from which the temperature and pressure conditions within each chamber may be derived and displayed as respective temperature and pressure measurements, according to the associated operating software stored within memory 82. The various operating conditions are graphically presented to an operator via a user interface of the operating software, the user interface and associated measurements being displayed, in response to user input, on display device 86 of control system 80.

In one or more embodiments, the memory 82 of control system 80 further includes instructions executable by the processor 84 to initiate display, on the display device 86, a first drawing comprising a plurality of static graphical objects. In embodiments, each static graphical object corresponds to a design element of the cluster tool 10. Examples of design elements includes position sensing transducers, pressure sensing transducers, temperature sensing transducers, valves such as slit valves and/or gas flow valves, switches such as processing chamber lid switches, electrical connectors such as wires and terminal blocks, electrical elements of DC power biasing circuitry, and the like. In an embodiment, user input collected at control system 80 identifies an electrical schematic relevant to a diagnostic or test procedure and control system 80 responds by retrieving and displaying, at display device 86 the identified schematic.

According to one or more embodiments, memory 82 of control system 80 further includes instructions executable by the processor 84 to identify a diagnostic schematic overlay comprising a plurality of fields, wherein each field of the plurality of fields is aligned with a design element represented in a display as a static graphical object of the plurality of static graphical objects. The overlay further includes a plurality of dynamic graphical objects. In an embodiment, one or more graphical object is associated with each field. When populated with dynamic graphical objects, the fields collectively form a diagnostic schematic overlay customized for a particular drawing and may, in some embodiments, reflect a recent or real-time operating state and/or real time operating parameter(s) of each design element represented by a static graphical object (or a subset of such design elements).

In an embodiment, a database accessible from control system 80 contains one or more schematic diagrams comprising a plurality of static graphical objects associated with respective design elements of a component of cluster tool 10, as well as one or more dynamic overlays. In some embodiments, the database includes a data table making an association between a drawing comprising static graphical design elements and a corresponding diagnostic schematic overlay. Each drawing and/or overlay may, in turn, contain references to other drawings and overlays which may be selected by further user input (e.g., by clicking on a hypertext markup language link), causing the control system 80 to display a subsequent drawing-overlay pair.

In embodiments, memory 82 of control system 80 further includes instructions executable by the processor 84 to determine at least one of a design element operating state or a design element operating parameter of at least some of the static graphical objects at an instant in time. Examples of design element operating states include an open or closed state of a switch or valve, or an energized or de-energized state of a relay. Examples of a design element operating parameter include a measurement (e.g. an instantaneous pressure, temperature, or angular position derived from a transducer output) and/or instantaneous voltage or impedance value from which a corresponding measurement is derived. In an embodiment, the design element operating parameters and design element operating states are retrieved from software and/or hardware drivers used to operate the cluster tool 10.

In embodiments, execution of instructions by processor 84 causes control system 80 to initiate display operating states and determined operating parameters as a dynamically updated diagnostic schematic overlay superimposed upon a drawing depicting design elements as an interconnected grouping of static graphical objects. Operating and diagnostic evaluation of a complex system such as the cluster tool 10 of FIG. 1A may be achieved by operating one or more components of the complex system according to a normal production regime or, alternatively, according to a diagnostic regime selected based on certain observed behavior. One such component of a complex system is depicted in FIG. 1B, though such depiction is for purposes of illustration only since aspects of the present disclosure are relevant to an extensive variety of complex systems and components thereof.

Figure 1B:
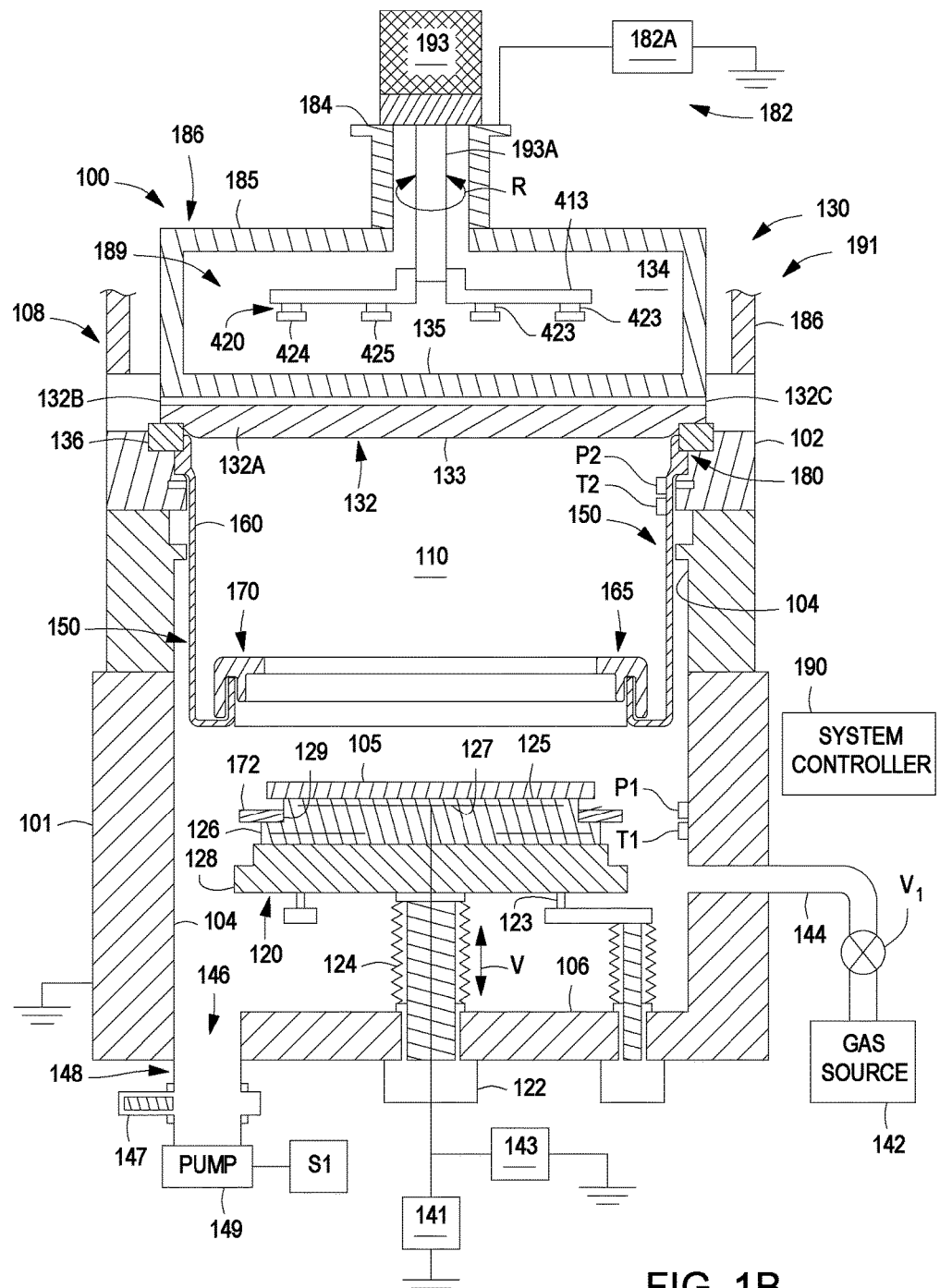
FIG. 1B is an elevation view depicting the internal arrangement of components of a sub-system compatible with the exemplary complex system of FIG. 1A, for which a dynamic overlay may be prepared as part of a trouble shooting operation in accordance with one or more embodiments of the present disclosure.

FIG. 1B depicts a chamber 100 which may be used to perform one or more substrate processing and/or substrate testing operations. The chamber 100 includes an upper process assembly 108, a process kit 150 and a pedestal assembly 120, and may be configured to process substrate 105 disposed in processing region 110. The chamber 100 may be a tungsten PVD deposition chamber serving as first process chamber 12 or second process chamber 14 of cluster tool 10 shown in FIG. 1A. The process kit 150 includes a one-piece grounded shield 160, a lower process kit 165, and an isolator ring assembly 180. In the version shown, the chamber 100 comprises a sputtering chamber, also called a physical vapor deposition or PVD chamber, capable of depositing a single material from target 132A onto the substrate 105.

The chamber 100 includes a chamber body 101 having sidewalls 104, a bottom wall 106, and an upper process assembly 108 that enclose a processing region 110 or plasma zone. The chamber body 101 is typically fabricated from welded plates of stainless steel or a unitary block of aluminum. In one embodiment, the sidewalls comprise aluminum and the bottom wall comprises stainless steel plate. The sidewalls 104 generally contain a slit valve (not shown) to provide for entry and egress of a substrate 105 from the chamber 100. Components in the upper process assembly 108 of the chamber 100 in cooperation with the grounded shield 160, pedestal assembly 120 and cover ring 170 confine the plasma formed in the processing region 110 to the region above the substrate 105.

A pedestal assembly 120 is supported from the bottom wall 106 of the chamber 100. The pedestal assembly 120 supports a deposition ring 172 along with the substrate 105 during processing. The pedestal assembly 120 is coupled to the bottom wall 106 of the chamber 100 by a lift mechanism 122, which is configured to move the pedestal assembly 120 between an upper processing position and lower transfer position. Additionally, in the lower transfer position, lift pins 123 are moved through the pedestal assembly 120 to position the substrate a distance from the pedestal assembly 120 to facilitate the exchange of the substrate with a substrate transfer mechanism disposed exterior to the chamber 100, such as a single blade robot (not shown). A bellows 124 is typically disposed between the pedestal assembly 120 and the bottom wall 106 to isolate the processing region 110 from the interior of the pedestal assembly 120 and the exterior of the chamber.

The pedestal assembly 120 generally includes a support 126 sealingly coupled to a platform housing 128. The platform housing 128 is typically fabricated from a metallic material such as stainless steel or aluminum. A cooling plate (not shown) is generally disposed within the platform housing 128 to thermally regulate the support 126.

The support 126 may be comprised of aluminum or ceramic. The substrate support 126 has a substrate receiving surface 127 that receives and supports the substrate 105 during processing, the substrate receiving surface 127 being substantially parallel to a sputtering surface (e.g. first surface 133) of the target 132A of target assembly 132. The support 126 also has a peripheral edge 129 that terminates before an overhanging edge 105A of the substrate 105. The support 126 may be an electrostatic chuck, a ceramic body, a heater or a combination thereof. In one embodiment, the support 126 is an electrostatic chuck that includes a dielectric body having an electrode (e.g., a conductive layer 125), embedded therein.

The dielectric body is typically fabricated from a high thermal conductivity dielectric material such as pyrolytic boron nitride, aluminum nitride, silicon nitride, alumina or an equivalent material. Other aspects of the pedestal assembly 120 and support 126 are further described below. In one embodiment, the conductive layer 125 is configured so that when a DC voltage is applied to the conductive layer 125, by an electrostatic chuck power supply 143, a substrate 105 disposed on the substrate receiving surface 127 will be electrostatically chucked thereto to improve the heat transfer between the substrate 105 and the support 126. In another embodiment, an RF bias controller 141 is also coupled to the conductive layer 125 so that a voltage can be maintained on the substrate during processing to affect the plasma interaction with the surface of the substrate 105.

The chamber 100 is controlled by a system controller 190 that is generally designed to facilitate the control and automation of the chamber 100 and typically includes a central processing unit (CPU) (not shown), memory (not shown), and support circuits (or I/O) (not shown). The CPU may be any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, dock circuits, input/output circuitry, subsystems, and the like.

A program (or computer instructions) readable by the system controller 190 determines which tasks are performable on a substrate. In embodiments, the program is software readable by the system controller 190 that includes code to perform tasks relating to monitoring, execution and control of the movement and various process recipe tasks and recipe processes being performed in the chamber 100. For example, the system controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve or gate valve to maintain a pressure in the chamber 100; a temperature control instruction set to control a temperature control system (not shown) in the pedestal assembly 120 or sidewalls 104 to set temperatures of the substrate or sidewalls 104, respectively; and a process monitoring instruction set to monitor the process in the chamber 100.

The software executed by the processor of system controller 190 causes system controller 190 to collect, store in memory, and process real time operating parameter data such as the voltages (volts), resistances (ohms), and current (amperes), and/or other analog or digital output from various temperature, pressure, position, and gas flow sensors. From the collected data, the system controller 190 derives actual values of temperature, pressure and gas flow, for use as feedback and compliance with set points for a particular substrate processing recipe. For the same reason, system controller 190 monitors the operating state or status of various devices such, for example, as slit valves, lid position switches, relays, and the like. In embodiments consistent with the present disclosure, the dynamic graphical objects of a diagnostic schematic overlay may be updated using the data collected by system controller 190.

The chamber 100 also contains a process kit 150 which comprises various components that can be easily removed from the chamber 100, for example, to clean sputtering deposits off the component surfaces, replace or repair eroded components, or to adapt the chamber 100 for other processes. In one embodiment, the process kit 150 comprises an isolator ring assembly 180, a grounded shield 160 and a ring assembly 168 for placement about a peripheral edge 129 of the support 126 that terminates before an overhanging edge of the substrate 105.

The target assembly 132 includes a target 132A, a bonding layer 132B, and a backing plate 132O, in the chamber 100. The target 132A has a first surface 133 that is in contact with the processing region 110 of the chamber 100 and a second surface 135 that is opposite the first surface 133. In an embodiment, energy is delivered to a plasma formed in processing region 110 from a direct current (DC) power supply 182A of DC power supply 182 to the target 132A. The DC power may be applied to the target at a power level within the range from about 1 kW to about 3.0 kW, such as about 1.5 kW or 2.0 kW. In some embodiments, the process of forming a thin film on a substrate 105 disposed within chamber 100 may use only a DC power source coupled to the target 132A along with an RF bias coupled to a substrate support. However, although FIG. 1B shows only a DC power source coupled to the target, the chamber may have both an RF and a DC power source coupled to the target in some embodiments.

The upper process assembly 108 may also comprise an RF power supply (not shown), an adaptor 102, a motor 193, and a lid assembly 130. The lid assembly 130 generally comprises target assembly 132, a magnetron system 189, and a lid enclosure 191. The upper process assembly 108 is supported by the sidewalls 109 when in a closed position, as shown in FIG. 1B. A ceramic target isolator 136 is disposed between the isolator ring assembly 180, the target assembly 132, and adaptor 102 of the lid assembly to prevent vacuum leakage therebetween. The adaptor 102 may be sealably coupled to the sidewalls 104, and configured to help with removal of the upper process assembly 108 and lower process kit 165.

When in the processing position, the target 132A of target assembly 132 is disposed adjacent to the adaptor 102, and is exposed to the processing region 110 of the chamber 100. The target 132A contains material that is deposited on the substrate 105 during a PVD, or sputtering, process. The isolator ring assembly 180 is disposed between the target 132A and the shield 160 and chamber body 101 to electrically isolate the target 132A from the shield 160 and chamber body 101.

During processing, the target assembly 132 is biased relative to a grounded region of the processing chamber (e.g., chamber body 101 and adaptor 102) by a power source disposed in an RF power supply (not shown) and/or the direct current (DC) power supply 182. In one embodiment, an RF power supply comprises an RF power supply and an RF match (neither of which are shown) that are configured to efficiently deliver RF energy to the target 132A. In one example, the RF power supply is capable of generating RF currents at a frequency of between about 13.56 MHz and about 60 MHz at powers between about 0 and about 4.5 kW. In one example, the DC power supply 182A in the DC power supply 182 is capable of delivering between about 0 and about 2.5 kW of DC power. In another example, the RF power supply is capable of generating an RF power density of between about 15 and about 45 kW/m2 at the target and the DC power supply 182 is capable of delivering a power density of between about 15 and about 45 kW/m$^2$.

During processing, a gas, such as argon, is supplied to the processing region 110 from a gas source 142 via conduits 144. The gas source 142 may comprise a non-reactive gas, such as argon, krypton, helium or xenon, capable of energetically impinging upon and sputtering material from the target 132A. The gas source 142 may also include a reactive gas, such as one or more of an oxygen-con or a nitrogen-containing gas, capable of reacting with the sputtering material to form a layer on a substrate. Spent process gas and byproducts are exhausted from the chamber 100 through exhaust ports 146 that receive spent process gas and direct the spent process gas to an exhaust conduit 148 having an adjustable position gate valve 147 to control the pressure in the processing region 110 in the chamber 100. The exhaust conduit 148 is connected to an exhaust pump 149, such as a cryopump. Typically, the pressure of the sputtering gas in the chamber 100 during processing is set to sub-atmospheric levels, such as a vacuum environment, for example, a pressure of about 1.0 mTorr to about 10.0 mTorr. In one embodiment, the processing pressure is set to about 2.5 mTorr to about 6.5 mTorr. A plasma is formed between the substrate 105 and the target 132A from the gas. Ions within the plasma are accelerated toward the target 132A and cause material to become dislodged from the target 132A of target assembly 132. The dislodged target material is deposited on the substrate.

The lid enclosure 191 of the chamber 100 shown in FIG. 1B generally comprises a conductive wall 185, a center feed 184 and shielding 186. In the configuration of FIG. 1B, the conductive wall 185, the center feed 184, the backing plate 132C of target assembly 132, and a portion of the motor 193 enclose and form the back region 134. The back region 134 is a sealed region disposed on the back surface of the backing plate 132C of target assembly 132. The back region is generally filled with a flowing liquid during a process involving the chamber 100. The flowing liquid removes heat generated at the target 132A during such a process. In one embodiment, the conductive wall 185 and center feed 184 are configured to support the motor 193 and magnetron system 189, so that the motor 193 can rotate the magnetron system 189 during processing.

In embodiments, magnetron system 189 may rotate about the center point of the target 132A, wherein the magnetron system 189 is disposed adjacent the second surface 135 of the target 132A to create a magnetic field in the processing region 110 adjacent the first surface 133. The magnetic field created serves to trap electrons and ions, increase the plasma density, and increase the sputtering rate. According to one embodiment consistent with the present disclosure, the magnetron system 189 includes a source magnetron assembly 420 that comprises a rotation plate 413, an outer pole 424, and an inner pole 425. Each of the outer pole 424 and inner pole 425 comprises a plurality of magnets 423. The magnetron system 189 and resulting magnetic fields affect the bombardment of ions from the target during the deposition process, and enables control of the thin film properties such as grain size and film density.

In one embodiment, a rotary shaft 193A powered by a motor 193 extends along a central axis and supports the rotation plate 413 and the source magnetron assembly 420. During processing, sputtering significantly heats the target 132A of target assembly 132. Accordingly, a back region 134 is sealed to the backing plate 132C of the target assembly 132 and is filled with a cooling liquid such as water, which may be chilled by a chiller (not shown) and water piping recirculating the cooling water (not shown). The rotary shaft 193A penetrates the chamber 100 through a rotary seal (not shown), and the magnetron system 189 is immersed in the liquid disposed in the back region 134.

The process may also include heating the substrate support (support 126) in the chamber. The support 126, or substrate disposed thereon, may be heated to a temperature within a range from about 200° C. to about 900° C. In one embodiment the substrate or support may be heated to a temperature within a range from about 250° C. to about 400° C. For example, the substrate or substrate support may be heated to about 250° C., about 300° C., about 350° C., or about 400° C.

To monitor conditions within chamber 100, pressure sensing transducers P1, P2, and temperature sensing transducers T1, T2, are included within chamber 100. A valve V1 for enabling or restricting the flow of a first process gas, and a switch S1, each operated by system controller 190, as well as a switch (not shown) for determining whether lid assembly 130 is in a seated or closed position for sealing the processing region 110 of chamber 100. Additional valves and switches may be associated with chamber 100, and that the aforementioned sensors, valves and switches are depicted and described herein for purposes of illustration only.

Figure 2:
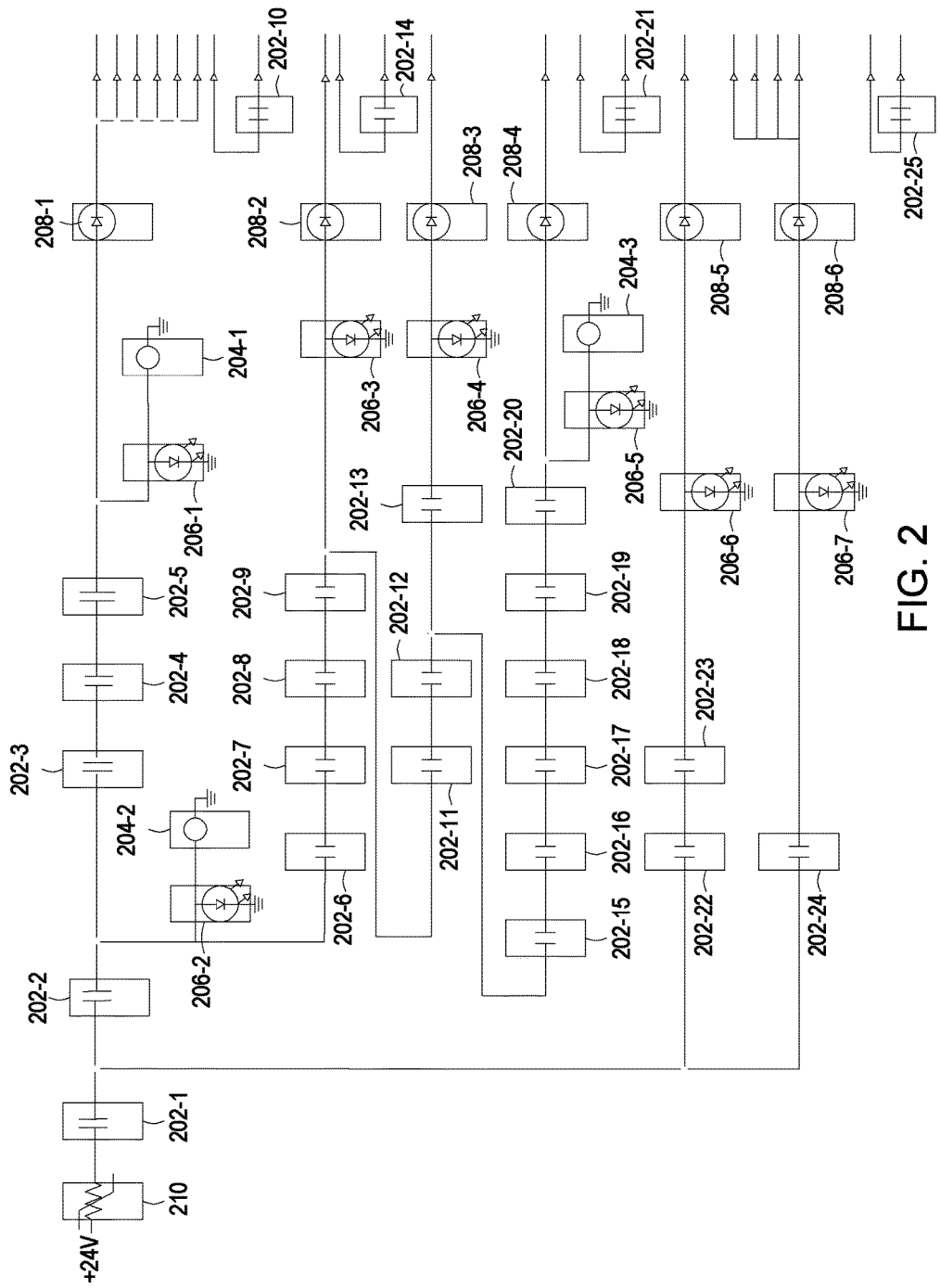
FIG. 2 depicts an exemplary drawing represented as a plurality of static graphical objects corresponding to design elements of a circuit 200, which circuit may comprise a subsystem of the chamber of FIG. 1B, any of the chambers and other components depicted in cluster tool of FIG. 1A, or of some other complex system, according to an embodiment of the present disclosure.

With reference now to FIG. 2, there is shown an exemplary drawing comprising static graphical objects representative of design elements of a circuit 200 which may comprise a subsystem of the chamber 100 of FIG. 1B, any of the chambers and other components depicted in cluster tool 10 of FIG. 1A, or of some other complex system. The respective design elements of the circuit 200 are coupled together, by discrete electrical conductors, terminal blocks, and the like, to form a circuit. Although electrical forms of connection are shown in FIG. 2 for the chamber 100, other complex systems (to which the overlay approach embodied in the present disclosure are equally suited) may use other forms of interconnection between at least some of the design elements forming the system. For example, in a hydraulic circuit, a source of hydraulic pressure may be coupled by flexible and/or rigid hydraulic lines to such elements as hydraulic cylinders and the like. Alternatively, or in addition, a source of vacuum or of pressure may be coupled by one or more fluid lines to enable the evacuation or pressurization of a chamber, respectively.

As seen in FIG. 2, the design elements comprise switches, indicated generally at 202-1 to 202-25, relays, indicated generally at 204-1, 204-2 and 204-3, light emitting diodes (LEDs), indicated generally at 206-1 to 206-7, diodes 208-1 to 208-6, and a temperature or pressure sensor indicated generally at 210. Outputs O1 to O22 are connected to respective terminals of a terminal block (not shown) which facilitates the use of a multi-meter or other measuring device to obtain voltage, current and/or impedance measurements during trouble shooting of the circuit 200. The operating state of the various design elements may change (e.g., be switched to an on state or an off state) and/or reflect a value which may change with respect to time or in accordance with the occurrence or absence of certain events or processing conditions (e.g, the voltage across pressure or temperature sensor 210 may change in a manner proportional, inversely proportional, or otherwise determined by a change pressure or temperature so as to form the basis of a derived measurement of pressure or temperature). However, the design elements themselves are presumed to remain part of the circuit 200 and, as such, the design elements are displayed as static graphical objects (i.e. they do not change with respect to time).

Figure 3:
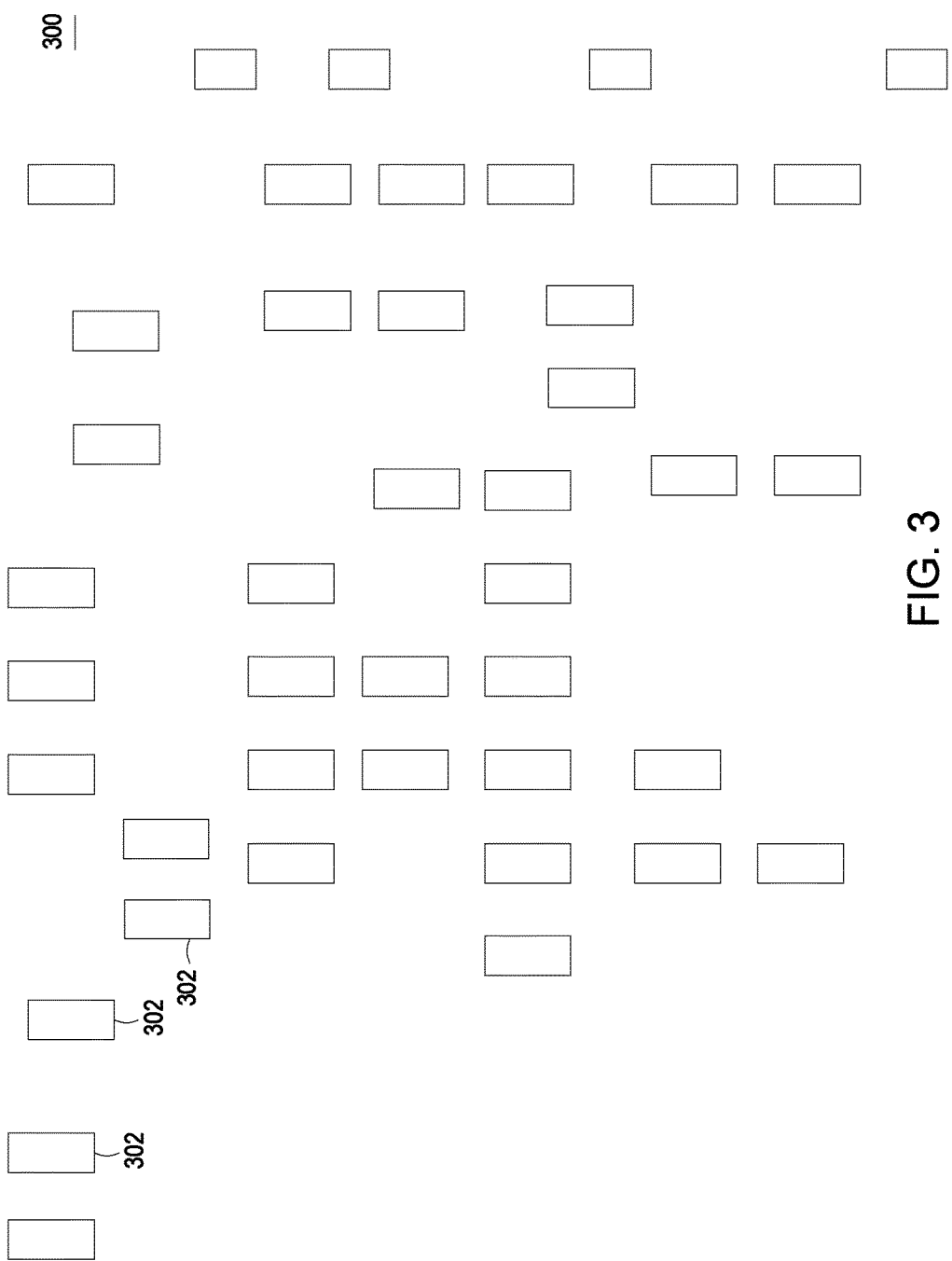
FIG. 3 depicts unpopulated fields respectively aligned with the static graphical objects representative of design elements of a drawing as depicted in FIG. 2, the fields forming a diagnostic schematic overlay to the drawing of FIG. 2 when populated with dynamic graphical objects according to one or more embodiments of the present disclosure.

FIG. 3 depicts a plurality of fields 302 respectively mapped to design elements of a corresponding schematic drawing such, for example, as circuit 200 of FIG. 2. When populated with dynamic graphical objects, fields 302 form the basis of a diagnostic schematic overlay 300. The fields 302 depicted in FIG. 3 are shown in an unpopulated state (e.g., prior to updating with the one or more dynamic graphical objects). In embodiments, the dynamic graphical objects are updated at regular intervals. Alternatively, or in addition, the dynamic graphical objects may be updated in response to receipt of a user instruction. At least some of the dynamic graphical objects may correspond to an operating state of a design element (e.g. an on or off state of a switch, an energized or de-energized state of a relay, an open or closed state of a relay contact, or a lit or unlit state of a light emitting diode) operating parameter of a design element, and so on). Other dynamic graphical objects may include operating parameters such as instantaneous pressure, temperature, or position measurement supplied by a design element as determined, for example, from software for monitoring the operation of the system with which circuit 200 and diagnostic schematic overlay 300 are associated. Additional operating parameters may include underlying voltage, current and/or impedance value from which the measurements are derived.

In some embodiments, each dynamic graphical object comprises a plurality of fields to facilitate the graphical presentation of multiple forms of information via respective dynamic graphical objects. In some embodiments, the dynamic graphical objects comprise a field for presenting a dynamically updated operating state of the design element associated with a corresponding static graphical object. In some embodiments, the dynamic graphical objects comprise a field for presenting a dynamically updated operating parameter of the design element associated with a corresponding static graphic element. In some embodiments, at least some of the dynamic graphical objects comprise a field for presenting a dynamically updated operating state of the design element associated with a corresponding static graphical object and a separate field for presenting a dynamically updated operating parameter of the design element associated with the same static graphic element.

Figure 4:
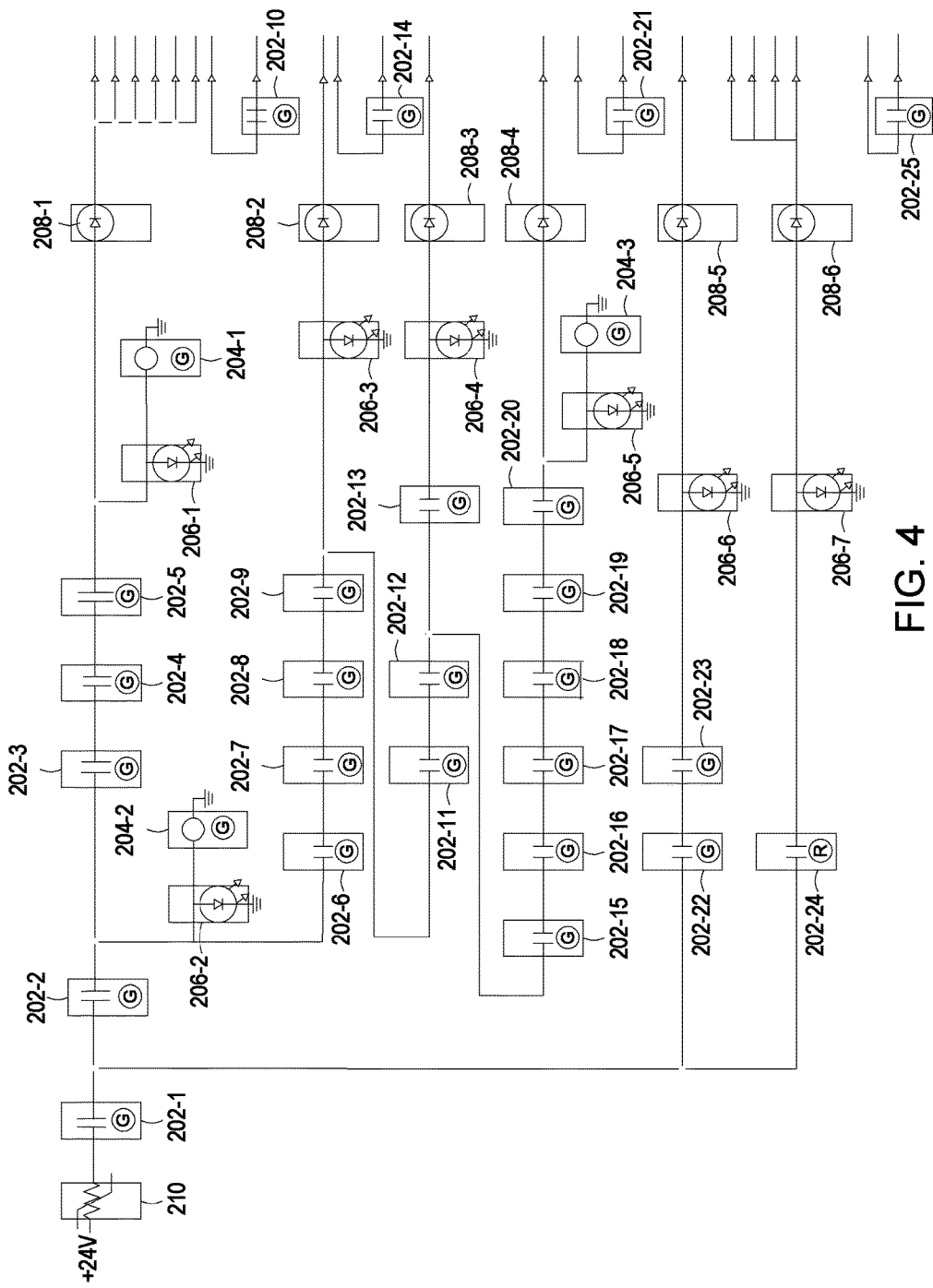
FIG. 4 depicts the superposition of the exemplary overlay of FIG. 3 upon the drawing depicted in FIG. 2, according to one or more embodiments of the present disclosure.

One or more overlays may be associated with a single, static graphical object-depicting drawing. In an embodiment, user input corresponding to identification of a particular set of troubleshooting symptoms may result in the selection of one overlay from one or more overlays associated with the same drawing. Once an association is made, an identified overlay is superimposed upon or otherwise combined with the applicable drawing. An exemplary result of the overlay operation is depicted in FIG. 4. In an embodiment, the color or some other visual attribute (e.g., shape, dotted vs. solid line, flashing vs non-flashing presentation, etc.) of the graphical objects may be used to communicate an operating state or operating parameter consistent and/or inconsistent with the expected operation of the corresponding design elements for a given set of process conditions.

In FIG. 4, for example, the static graphical objects displayed to represent each of relays 204-1 to 204-3 are shown with a green-colored dynamic graphical object as an overlay to depict an appropriately energized operating state, and each of switches 202-1 to 202-23 and 202-25 are also shown with a green-colored dynamic graphical object as an overlay to depict an appropriately closed operating state. Switch 202-24, on the other hand, is depicted as having a red-colored dynamic graphical object to represent an inconsistency with the expected operating state of that design element. In other embodiments, the color scheme or other form of design representation may merely convey a visually distinguishable operating state (e.g. open vs. closed) without regard to whether such state is appropriate for a given set of processing conditions.

Although FIG. 4 does not depict any dynamic graphical object in the overlay field aligned with sensor 210, such a field might, in embodiments, contain both a measurement of temperature in degrees Celsius (or a measurement of pressure in, for example, PSI) and a corresponding voltage value retrieved and used by operating software (not shown) to derive the temperature or pressure measurement.

Figure 5:
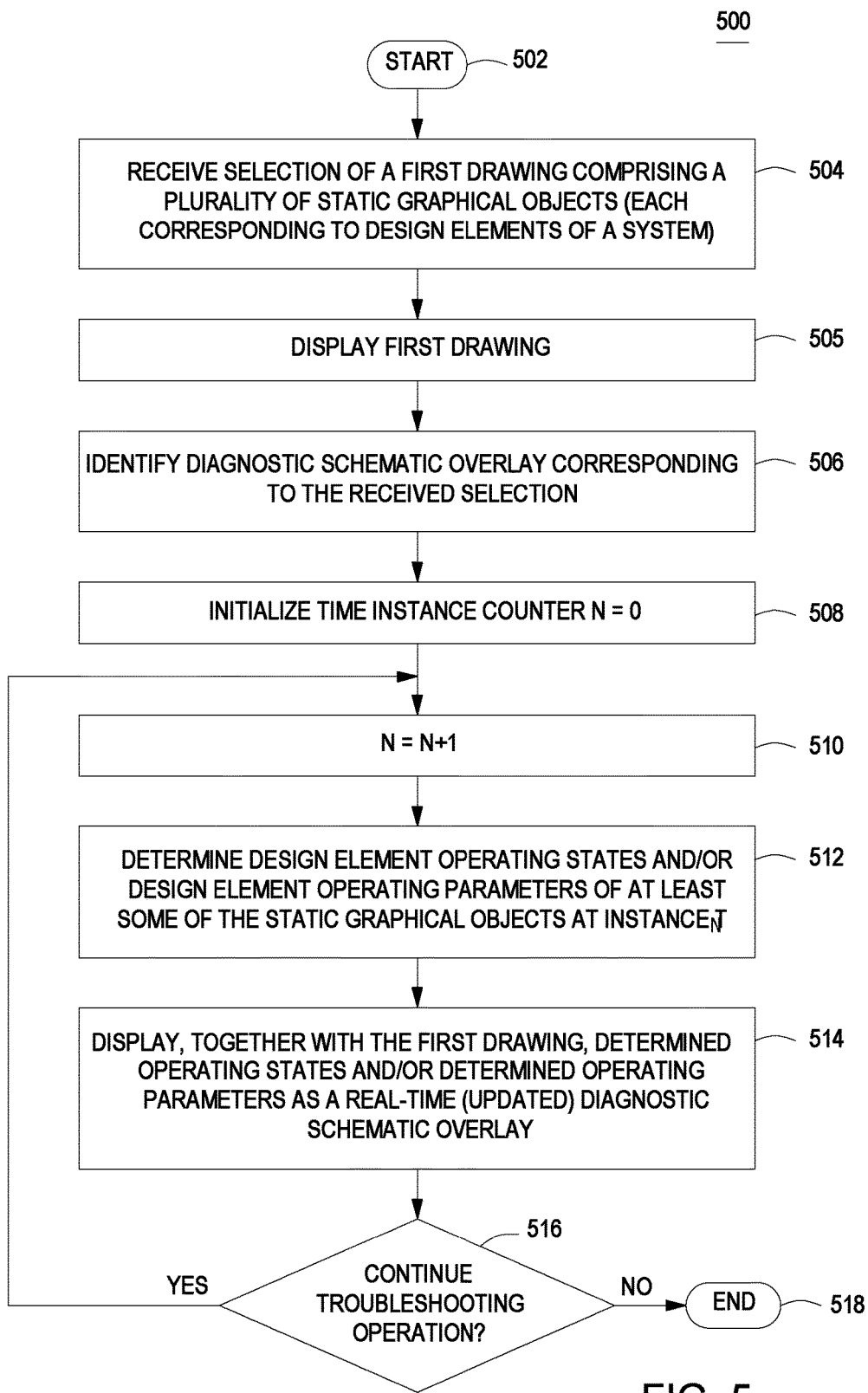
FIG. 5 depicts a method for dynamically updating an interactive diagnostic schematic overlay of dynamically updated graphical objects displayed in alignment with a drawing comprising a plurality of design elements each represented as static graphical objects and forming part of a schematic for a complex system, according to one or more embodiments consistent with the present disclosure.

FIG. 5 depicts a method 500 for dynamically updating an interactive diagnostic schematic overlay of dynamically updated graphical objects displayed in alignment with a drawing comprising a plurality of design elements each represented as static graphical objects and forming part of a system schematic, according to one or more embodiments consistent with the present disclosure.

The method 500 is entered at 502 and proceeds to 504. At 504, the method 500 receives a selection of a first drawing comprising a plurality of static graphical objects. Each of the static graphical objects corresponds to a design element of a complex system. The method 500 proceeds to 505. At 505, the method displays the first drawing and proceeds to 506.

At 506, the method identifies a diagnostic schematic overlay corresponding to the received selection. According to one or more embodiments, each diagnostic schematic overlay comprises one or both of a plurality of dynamic graphical objects, where each dynamic graphical object of the plurality of dynamic graphical objects is aligned with a static graphical object of the plurality of static graphical objects, and a plurality of fields, where each field of the plurality of fields is aligned with a static graphical object of the plurality of static graphical object. From 506, the method 500 proceeds to 508.

At 508, an update frequency or time instance counter N is initialized by setting the counter value to zero. At 510, the value of the time instance counter is incremented by 1. From 510, method 500 proceeds to 512.

At 512, method 500 determines design element determines at least one of a design element operating state or a design element operating parameter for at least some of the static graphical objects at the first instance in time $T_N$. In some embodiments, the design elements comprise one or more temperature sensing transducers, one or more pressure sensing transducers, one or more position sensors, electrical conductors, a power source having a constant voltage and/or current level, and/or a plurality of switches.

In an embodiment, the determining includes retrieving a plurality of the design element operating parameters, for one or more design element, from software being executed by a system controller to operate and/or test a complex system. The retrieved plurality of design element operating parameters may correspond to a single field or, alternatively, to a plurality of fields associated with the design element. Examples of design element operating parameters which may be retrieved for a given design element include an instantaneous voltage value as, for example, output by a temperature or pressure sensing transducer and/or an instantaneous temperature measurement or an instantaneous pressure measurement derived from a corresponding instantaneous voltage value.

According to one or more embodiments, at least some design element operating parameters or design element operating states are retrieved, during the determining, from software being executed by a processor to operate or test the complex system. In some embodiments, at least one design element of the complex system for which an overlay is dynamically updated comprises a switch and the determining comprises retrieving a closed or open status of the switch. In some embodiments, at least one design element of the complex system for which an overlay is dynamically updated comprises a relay and wherein the determining comprises retrieving an energized or de-energized status of the relay.

Method 512 proceeds to 514 and displays, together with the drawing displayed at 505, determined operating states and/or determined operating parameters as an updated diagnostic schematic overlay. At 516, method 500 determines whether further troubleshooting and dynamic updating of the overlay is appropriate. If so, the method 500 returns to 510, increments the time instance counter N, and performs a further iteration of 512 through 516. If not, the method 500 terminates at 518.

In some embodiments, 516 may include, as a subprocess (not shown), identifying, responsive to a user selection of a graphical object depicted in one of the first drawing or the diagnostic schematic overlay, a second drawing comprising a second set of static graphical objects, each static graphical object of the second set corresponding to a design element of the complex system, and displaying the second drawing. In response to the same user input at 516, method 500 may identify a second diagnostic schematic overlay and display the second diagnostic schematic overlay in alignment with the second drawing. In such embodiments, 516 would return method 500 to 508 and re-initialize the time instance counter N.

While the foregoing is directed to embodiments of the present disclosure, other and further embodiments consistent with the present disclosure may be devised without departing from the basic scope thereof.

The invention claimed is:

1. A computer implemented method of dynamically updating an interactive diagnostic schematic overlay, comprising:
    displaying a first drawing comprising a plurality of static graphical objects, each static graphical object corresponding to a design element of a complex system;
    identifying a diagnostic schematic overlay comprising:
        a plurality of fields, wherein each field of the plurality of fields is aligned with a static graphical object of the plurality of static graphical objects, and
        a plurality of dynamic graphical objects, wherein each dynamic graphical object of the plurality of dynamic graphical objects is associated with a field of the plurality of fields and corresponds to one of a design element operating state or a design element operating parameter;
    determining at least one of a design element operating state using a respective sensor for detecting such design element operating state or a design element operating parameter using a system controller for at least some of the static graphical objects at a first instance in time; and
    displaying, together with the first drawing, determined operating states and determined operating parameters in respective fields of the diagnostic schematic overlay as an updated diagnostic schematic overlay.

2. The computer implemented method of claim 1, wherein the complex system includes a chamber.

3. The computer implemented method of claim 2, wherein the complex system further comprises a plurality of design elements including one or more temperature sensing transducers, one or more pressure sensing transducers, one or more position sensors, electrical conductors, or switches.

4. The computer implemented method of claim 3, wherein a plurality of design element operating parameters correspond to a single field of the plurality of fields.

5. The computer implemented method of claim 1, wherein the determining comprises retrieving a plurality of design element operating parameters for at least one design element.

6. The computer implemented method of claim 5, wherein the plurality of design element operating parameters are retrieved from software for at least one of operating or testing the complex system.

7. The computer implemented method of claim 5, wherein the plurality of design element operating parameters retrieved for the design element include an instantaneous voltage value and one of an instantaneous temperature measurement or an instantaneous pressure measurement.

8. The computer implemented method of claim 1, wherein at least some design element operating parameters or design element operating states are retrieved, during the determining, from software being executed by a processor to operate or test the complex system.

9. The computer implemented method of claim 8, wherein at least one design element of the complex system comprises a switch and wherein the determining comprises retrieving a closed or open status of the switch.

10. The computer implemented method of claim 9, wherein the design element comprises a relay and wherein the determining comprises retrieving an energized or de-energized status of the relay.

11. The computer implemented method of claim 1, further comprising:
    identifying, responsive to a user selection of a graphical object depicted in one of the first drawing or the diagnostic schematic overlay, a second drawing comprising a second set of static graphical objects, each static graphical object of the second set corresponding to the design element of the complex system; and
    displaying the second drawing.

12. The computer implemented method of claim 11, further comprising identifying a second diagnostic schematic overlay responsive to the user selection, and displaying the second diagnostic schematic overlay in alignment with the second drawing.

13. A system for determining an operating state or operating condition of one or more design elements of a complex system having a plurality of design elements, comprising:
   a processor;
   a display device; and
   a memory containing instructions executable by the processor to:
   initiate display, on the display device, a first drawing comprising a plurality of static graphical objects, each static graphical object corresponding to a design element of a complex system;
   identify a diagnostic schematic overlay, comprising:
      a plurality of fields, wherein each field of the plurality of fields is aligned with a static graphical object of the plurality of static graphical objects, and
      a plurality of dynamic graphical objects, wherein each dynamic graphical object of the plurality of dynamic graphical objects is associated with a field of the plurality of fields and corresponds to one of a design element operating state or a design element operating parameter;
   determine at least one of a design element operating state using a respective sensor for detecting such design element operating state or a design element operating parameter using a system controller for at least some of the static graphical objects at an instant in time, and
   initiate display, on the display device together with the first drawing, determined operating states and determined operating parameters in respective fields of the diagnostic schematic overlay as an updated diagnostic schematic overlay.

14. The system of claim 13, further comprising the complex system, wherein the complex system includes at least one processing chamber.

15. The system of claim 13, wherein the instructions executable by the processor to determine at least one of the design element operating state or the design element operating parameter include instructions for retrieving a plurality of design element operating parameters for at least one design element.

16. The system of claim 15, wherein the instructions executable by the processor to determine at least one of the design element operating state or the design element operating parameter include instructions for retrieving at least one of the design element operating parameter or the design element operating state from software instructions executable by a processor to operate or test the complex system.

17. The system of claim 15, wherein the complex system includes at least one of a temperature sensor or pressure sensor, and wherein instructions are executable by the processor to retrieve an instantaneous voltage value and one of an instantaneous temperature measurement or an instantaneous pressure measurement.

18. A method of dynamically updating an interactive diagnostic schematic overlay, comprising:
   displaying a plurality of static graphical objects, each static graphical object corresponding to a design element of a complex system;
   determining at least one of a design element operating state using a respective sensor for detecting such design element operating state or a design element operating parameter using a system controller; and
   displaying, together with the static graphical objects, determined operating states and determined operating parameters in respective fields of the diagnostic schematic overlay as an updated diagnostic schematic overlay.

19. The method of claim 18, wherein the determining comprises retrieving a plurality of design element operating parameters for at least one design element.

20. The method of claim 19, wherein the plurality of design element operating parameters retrieved for the at least one design element include an instantaneous voltage value and one of an instantaneous temperature measurement or an instantaneous pressure measurement.

* * * * *